United States Patent [19]
Lin et al.

[11] Patent Number: 5,248,384
[45] Date of Patent: Sep. 28, 1993

[54] RAPID THERMAL TREATMENT TO ELIMINATE METAL VOID FORMATION IN VLSI MANUFACTURING PROCESS

[75] Inventors: Kwang-Ming Lin; Lih-Shyng Tsai; Jiunn-Jyi Lin; Chin-Twan Wei, all of Hsin-Chu, Taiwan

[73] Assignee: Taiwan Semiconductor Manufacturing Company, Hsin-Chu, Taiwan

[21] Appl. No.: 803,518

[22] Filed: Dec. 9, 1991

[51] Int. Cl.⁵ .......................................... H01L 21/00
[52] U.S. Cl. .................... 156/643; 156/656; 156/657; 156/659.1; 156/664; 156/665; 156/666; 156/668
[58] Field of Search ............ 156/643, 659.1, 664, 156/668, 665, 657, 666, 656, 644; 437/198, 228

[56]  References Cited
U.S. PATENT DOCUMENTS

Re. 32,207  7/1986  Levinstein et al. ............ 156/656 X
4,618,878  10/1986  Aoyama et al. ................ 156/644 X Primary Examiner—Thi Dang
Attorney, Agent, or Firm—George O. Saile

[57] ABSTRACT

The method of forming a void-free surface on aluminum-copper metallurgy after stripping of resist is described. There is provided an aluminum-copper metallurgy on a suitable substrate, such as a semiconductor integrated circuit wafer during manufacture. A resist layer is formed over surface. The resist layer is exposing, developing and the developed resist is used as an etch mask to etch a layer, such as an insulating layer on the metallurgy which results in exposing the aluminum-copper metallurgy surface. The resist etch mask is removed by plasma oxygen ashing in presence of the exposed aluminum-copper surface. Rapid thermal annealing of the aluminum-copper metallurgy at a temperature of between about 400° to 550° C. is performed. The resulting surfaces are rinsed to remove any residual resist material. The result is a void-free aluminum-copper metallurgy surface.

19 Claims, 1 Drawing Sheet

RAPID THERMAL TREATMENT TO ELIMINATE METAL VOID FORMATION IN VLSI MANUFACTURING PROCESS

BACKGROUND OF THE INVENTION (1) Field of the Invention

The invention relates to methods for forming void-free aluminum-copper metallurgy in the manufacture of integrated circuit.

(2) Description of the Prior Art

In the VLSI manufacturing process, aluminum is widely used as an interconnection metallurgy due to its low resistivity and process compatibility. Aluminum reacts with silicon dioxide, forming aluminum oxide to enhance adhesion.

As device geometry goes down to submicron, aluminum-copper or aluminum-copper-silicon alloy which dramatically improves electomigration resistance and hillock suppression becomes very important metallurgy material. However, with the addition of copper, the metal film is more susceptible to surface voiding during the photoresist stripping step after passivation etching and metal corrosion during metal etching.

The photoresist stripping void formation problem is apparently a micro-corrosion phenomenon which weakens the bondability and induces contact failure.

An object of this invention is to provide a method to over come this void formation in the aluminum/copper metallurgy surfaces.

An further object of this invention is to provide a thermal treatment process before the resist rinsing step with which eliminates the metal void formation on the aluminum/copper surfaces.

SUMMARY OF THE INVENTION

In accordance with the present invention, a method of forming a void-free surface on aluminum-copper metallurgy after stripping of resist is described. There is provided an aluminum-copper metallurgy on a suitable substrate, such as a semiconductor integrated circuit wafer during manufacture. A resist layer is formed over the surface. The resist layer is exposing, and developed and the resist is used as an etch mask to etch a layer, such as an insulating layer on the metallurgy which results in exposing the aluminum-copper metallurgy surface. The resist etch mask is removed by plasma oxygen ashing in presence of the exposed aluminum-copper surface. Rapid thermal annealing of the aluminum-copper metallurgy at a temperature of between about 400° to 550° C. is performed. The resulting surfaces are rinsed to remove any residual resist material. The result is a void-free aluminum/copper metallurgy surface.

DESCRIPTION OF THE PREFERRED EMBODIMENTS

Figure 1:
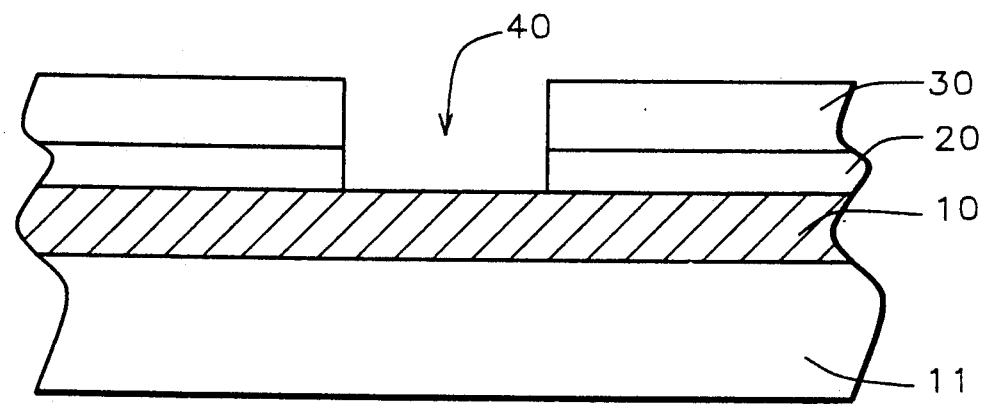
FIG. 1 is a schematic, cross-sectional representation of the structure that is formed according to the process of the invention.

Referring now more particularly to FIG. 1, an aluminum/copper metallurgy layer 10, is deposited on a substrate semiconductor wafer 11. Although not illustrated for simplicity, there would be device structure in and over the surface of the semiconductor wafer as is understood by those skilled in the art. An insulating layer 20 is now formed by conventional processing over the metallurgy layer 10. The layer 20 is typically silicon oxide, or a combination of layers of silicon oxide and silicon nitride. Resist layer 30 is coated thereover, exposed, developed and formed into the desired etch mask for etching the desired pattern in the insulating layer 20. The etched pattern is done using typically an anisotropic etching process as is known in the art. The purpose of the etched pattern may be, for example to form bond pad opening and contact hole, region 40. The resist layer 30 is removed by, for example the oxygen plasma ashing technique.

In the prior art, any residual resist would be now removed using rinsing in a organic resist solvent, such as EKC followed by rinsing in first isopropyl alcohol and second deionized water. This solution rinsing/cleaning process of the prior art effective, removes all of the resist residue, but generates voids on the exposed surfaces of the aluminum/copper metallurgy.

Figure 2:
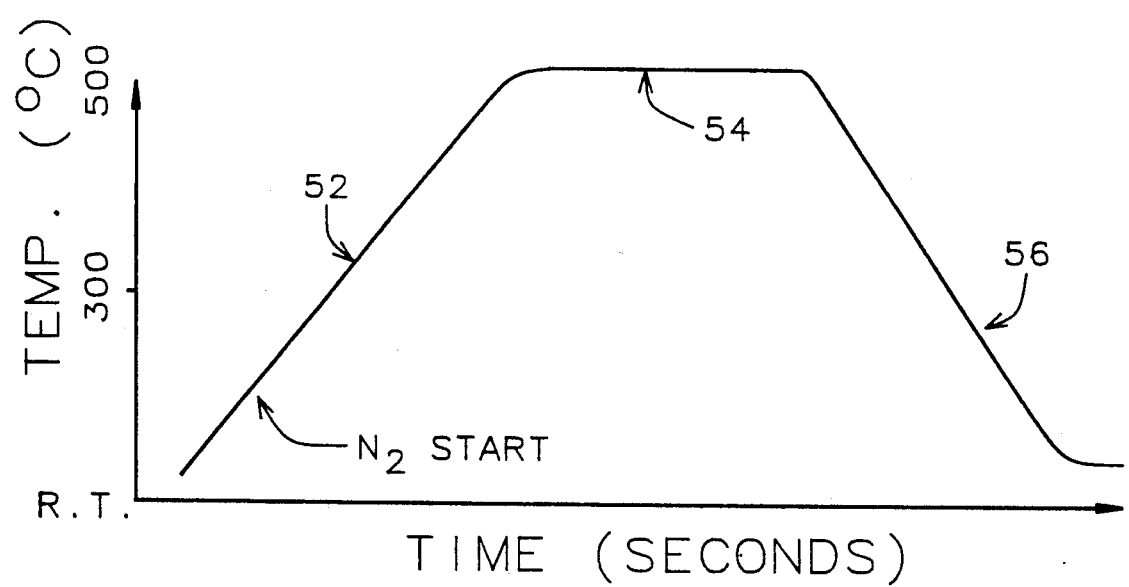
FIG. 2 graphically illustrates the rapid thermal annealing process portion of the process of the present invention.

The void formation has been overcome and eliminated by the use of a rapid thermal annealing process after the oxygen ashing process and before the stripping of the organic resist residue from the surfaces of the integrated circuit in process of manufacture. The process may be illustrated with reference to the graphical representation of FIG. 2. The exposed aluminum-copper metallurgy surface is now rapidily ramped in temperature from room temperature (R.T.) along the graph 52 in an inert atmosphere, such as nitrogen to between 400° to 550° C. temperature and preferrably about 400° to 500° C. The structure is held at this temperature on the graph at 54 for less than 60 seconds and preferrably between about 20 to 40 seconds. The ramp done temperature at 56 is down rapidly using flow of inert gas, such as nitrogen. It is very important that the ramp down proceeds at a rate of at least 5 degrees per second and preferrably 10 degrees per second down to the temperature of 300° C. Below about 300° C., the cooling of the structure can be done more slowly.

While the theory under which this process accomplishes the void-free metallurgy surface result cannot be fully understood, the following is one possible explanation for our results. In the actual integrated circuit semiconductor processing, copper content in aluminum alloy usually ranges from 0.5% to 4%. Based on this fact and combined with the known aluminum-copper, Al-Cu two phase diagram as given in "Constitution of Binary Alloy" Published by McGraw-Hill Book Co., New York, N.Y. in 1958 ISBN 07-0260508 pages 84-85, we could deduce that the composition of Al alloy is located on Alpha+Theta region and very close to pure Alpha-Al region. By the Lever's rule as given in "Introduction to Phase Equilibria in Ceramic System" by F. A. Hummel, Published by Marcel Dekker, Inc. 270 Madison Avenue, New York, N.Y. in 1984 pages 63-65, the Al alloy ends up with more than 90% of Alpha-Al and few percent of the Theta phase Al ($Al_2Cu$). It is the $Al_2Cu$ which activates the $Al_2Cu + Al \rightarrow Al^{+3}$ spontaneous electrochemical reaction resulting in metal voids. Each $Al_2Cu$ spot forms a micro cathode while Al itself acts as anode. The more the Theta-phase Al is gathered the larger the void will be. This demonstrates the result that the high temperature environment provides Cu more chance to conglomerate.

The rapid thermal anneal treatment drives the Al alloy from original Alpha-Theta region to pure Alpha-Al region. As the wafer is quenched down to room temperature, the Al alloy is kept in desired Alpha-Al region.

The following Examples are given to show the important features of the invention and to aid in the understanding thereof and variations may be made by one skilled in the art without departing from the spirit and scope of the invention.

EXAMPLES

The experiment design is given in the Table. The sputtering temperature was split between room temperature (A in the table) and to 250° C. (B in the table), respectively. It should be noted that rapid thermal annealing treatment is incorporated into either step 3 or step 8 with the temperature being set at 500° C. and the time being set at 20 to 40 seconds, C or D in the Table, respectively. Double layers of insulating films (5000 Angstroms plasma emhanced silicon oxide and 7000 Angstroms plasma enhanced silicon nitride) were deposited on aluminum/copper metal layer. Bond pad was opened by plasma etching applying gas mixture of He, $CF_4$, $CHF_3$ with photoresist as mask. Photoresist was removed by oxygen plasma ashing followed by organic resist solvent, ERC wet cleaning, isoprophy alcohol dip, deionized water rinsing and finally spinning dry. The metal voids were inspected by microscope.

TABLE

| Step | Split Conditions | EXAMPLES | | | | | | | | | | | | | | | | | | | | | | | |
|---|---|---|---|---|---|---|---|---|---|---|---|---|---|---|---|---|---|---|---|---|---|---|---|---|
| | | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 |
| 1 | Sputter (A) cold (B) hot 250° C. | A | A | A | A | A | A | A | A | A | A | B | B | B | B | B | B | B | B | B | B | | | | |
| 2 | Passivation-All | | | | | | | | | | | | | | | | | | | | | | | | | |
| 3 | 500° C. Anneal (C) 20" (D) 40" | | | C | C | D | D | | | | | | | | C | C | D | D | | | | | | | | |
| 4 | Photoresit-All | | | | | | | | | | | | | | | | | | | | | | | | | |
| 5 | Bake-All 150° C. | | | | | | | | | | | | | | | | | | | | | | | | | |
| 6 | Etch-All | | | | | | | | | | | | | | | | | | | | | | | | | |
| 7 | $O_2$ Ashing | | | | | | | | | | | | | | | | | | | | | | | | | |
| 8* | Anneal (C)(D) | | | | | | | C | C | D | D | | | | | | | | C | C | D | D | | | | |
| 9 | EKC-All | | | | | | | | | | | | | | | | | | | | | | | | | |
| Void Inspection | | | | | | | | * | * | * | * | | | | | | | | * | * | * | * | | | | |

Remarks: *no void

The results of the experiments were as follows. We found that Examples #7-10, #17-20 wafers produced a negliblle number of voids as compared with other Examples. It follows that the rapid thermal annealing process was effective when it is introduced right before the organic resist solvent, EKC treatment. Comparing Examples #7-10 (room temperature sputter) with Examples #17-20 (250° C. sputter), we conclude that hot sputtering is better than cold sputtering from the metal void point of view. Comparing Example #17 with #19, we know that a temperature of 500° C. and the time set at 20 seconds is enough to prevent void formation. Comparing Example #1 (cold sputter) with Example #11 (hot sputter), the former voids look small but dense, while the latter ones look large but sporadic.

While the invention has been particularly shown and described with reference to the preferred embodiments thereof, it will be understood by those skilled in the art that various changes and modifications can be made in the invention without departing from the spirit and scope of the invention.

What is claimed is:

1. Method of forming a void-free surface on an aluminum-copper metallurgy layer after stripping of resist comprising:
   providing an aluminum-copper metallurgy layer on a substrate;
   forming a resist layer over said metallurgy layer;
   exposing the resist layer to a metallurgy etch pattern, developing the resist layer to produce the etch pattern, and using the developed resist layer as an etch mask to remove the exposed areas of said metallurgy layer not covered by the etch pattern of said resist layer;
   removing said resist layer by plasma oxygen ashing in presence of said aluminum-copper layer;
   rapid thermal annealing of said aluminum-copper metallurgy layer at a temperature of between about 400° to 550° C. and cooling said metallurgy layer from said temperature at a rate of at least 5 degrees °C. per second to at least a temperature of 300 degrees °C.; and
   rinsing the surfaces of the metallurgy layer and substrate to remove any residual resist material.

2. The method of claim 1 wherein said aluminum-copper metallurgy was formed by sputtering.

3. The method of claim 1 wherein said aluminum-copper metallurgy includes a silicon component.

4. The method of claim 1 wherein said aluminum-copper metallurgy has less than about 4% copper.

5. The method of claim 1 wherein the said annealing is less than about 500° C.

6. The method of claim 1 wherein said rinsing includes a resist solvent rinse, an alcohol rinse and a deionized water rinse.

7. Method of forming a void-free surface on aluminum-copper metallurgy after stripping of resist comprising:
   providing an aluminum-copper metallurgy on a substrate;
   forming an insulating layer over said aluminum-copper metallurgy;
   forming a resist layer over said insulating layer;
   exposing the resist layer to a pattern, developing the exposed resist layer to produce the pattern, and using the developed resist layer as an etch mask to etch said insulating layer down to the surface of said aluminum-copper metallurgy;
   removing said resist layer by plasma oxygen ashing in presence of the exposed said aluminum-copper metallurgy surface;

rapid thermal annealing of said aluminum-copper metallurgy at a temperature of between about 400° to 550° C. and cooling said metallurgy layer from said temperature at a rate of at least 5 degrees °C. per second to at least a temperature of 300 degrees °C.; and rinsing the surfaces of said insulating layer and said metallurgy to remove any residual resist material.

8. The method of claim 7 wherein said insulating layer is silicon oxide, said aluminum-copper metallurgy contains a silicon component, and there is less than about 4% copper in said metallurgy.

9. The method of claim 8 wherein said aluminum-copper metallurgy contains between about 0.5 to 4% copper and has a silicon component.

10. The method of claim 9 wherein said annealing is done in a nitrogen atmosphere at a temperature of less than about 550° C., and said quenching is caused by flow of nitrogen down to a temperature of less than about 300° C.

11. The method of claim 7 wherein said aluminum-copper metallurgy was formed by sputtering.

12. The method of claim 11 wherein said sputtering was done at a substrate temperature of more than about 250° C.

13. The method of claim 7 wherein said rinsing includes a resist solvent rinse, an alcohol rinse and a deionized water rinse.

14. The method of claim 13 wherein said annealing is done in a nitrogen atmosphere at a temperature of less than about 550° C., and said quenching is caused by flow of nitrogen down to a temperature of less than about 300° C.

15. The method of claim 7 wherein said aluminum-copper metallurgy includes a silicon component.

16. The method of claim 7 wherein said aluminum copper metallurgy has less than about 4% copper.

17. The method of claim 7 wherein the said annealing is less than about 550° C.

18. Method of forming a void-free surface on an aluminum-copper metallurgy layer after stripping of resist comprising:

providing an aluminum-copper metallurgy layer on a substrate;

forming a resist layer over said metallurgy layer;

exposing the resist layer to a metallurgy etch pattern, developing the resist layer to, produce the etch pattern, and using the developed resist layer as an etch mask to remove the exposed areas of said metallurgy layer not covered by the etch pattern of said resist layer;

removing said resist layer by plasma oxygen ashing in presence of said aluminum-copper layer;

rapid thermal annealing said aluminum-copper metallurgy layer at a temperature of between about 400° to 550° C. wherein the said annealing is done in an inert atmosphere, said annealing is done for less than about 60 seconds; and cooling said metallurgy layer from said temperature at a rate of less than about 5 degrees per second; and rinsing the surfaces of the metallurgy layer and substrate to remove any residual resist material.

19. Method of forming a void-free surface on aluminum-copper metallurgy after stripping of resist comprising:

providing an aluminum-copper metallurgy on a substrate;

forming an insulating layer over said aluminum-copper metallurgy;

forming a resist layer over said insulating layer;

exposing the resist layer to a pattern, developing the exposed resist layer to produce the pattern, and using the developed resist layer as an etch mask to etch said insulating layer down to the surface of said aluminum-copper metallurgy;

removing said resist layer by plasma oxygen ashing in presence of the exposed said aluminum-copper metallurgy surface;

rapid thermal annealing said aluminum-copper metallurgy at a temperature of between about 400° to 550° C. wherein the said annealing is done in an inert atmosphere, said annealing is done for less than about 60 seconds; and cooling said aluminum-copper metallurgy from said temperature at a rate of less than about 5 degrees per second; and rinsing the surfaces of said insulatiing layer and said metallurgy to remove any residual resist material.

* * * * *